(12) United States Patent
Koelling

(10) Patent No.: US 6,215,718 B1
(45) Date of Patent: Apr. 10, 2001

(54) ARCHITECTURE FOR LARGE CAPACITY HIGH-SPEED RANDOM ACCESS MEMORY

(75) Inventor: Jeffrey E. Koelling, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/330,766

(22) Filed: Jun. 11, 1999

Related U.S. Application Data
(60) Provisional application No. 60/088,961, filed on Jun. 11, 1998.

(51) Int. Cl.$^7$ ........................................... G11C 7/00
(52) U.S. Cl. ............................. 365/230.03; 365/230.01; 365/189.01; 365/63
(58) Field of Search ................ 365/189.01, 230.01, 365/230.03

(56) References Cited

U.S. PATENT DOCUMENTS

| | | | | |
|---|---|---|---|---|
| 5,926,431 | * | 7/1999 | Toda | 365/230.03 |
| 5,953,257 | * | 9/1999 | Inoue et al. | 365/189.01 |
| 6,055,202 | * | 4/2000 | Meritt | 365/230.03 |
| 6,075,728 | * | 6/2000 | Inoue | 365/189.01 |
| 6,104,630 | * | 8/2000 | Hidaka | 365/63 |
| 6,157,560 | * | 12/2000 | Zheng | 365/63 |

* cited by examiner

*Primary Examiner*—Viet Q. Nguyen
(74) *Attorney, Agent, or Firm*—Wade James Brady, III; Frederick J. Telecky, Jr.

(57) ABSTRACT

An architecture for a high-capacity high-speed synchronous dynamic random access memory (SRAM) (400) is disclosed. The SDRAM (400) includes memory cells logically arranged into a number of array banks (402a–402d). The array banks (402a–402d) each include first sub-banks (404a–404d) situated toward a first end of the SDRAM and second sub-banks (406a–406d) situated toward a second, opposing end of the SDRAM (400). Sub-bank buses (420a–420h), each of which includes a number of data I/O lines, couple each of the first sub-banks (404a–404d) to a first I/O circuit (412) situated toward the first end of the device, and couple each of the second sub-banks (406a–406d) to a second I/O circuit (414) situated toward the second end of the device. In this manner, overlap of the sub-bank buses (420a–420h) is limited toward the first and second ends of the device, eliminating the need to run data I/O lines across the device, and thus preventing a data I/O line routing bottleneck in the central portion of the SDRAM (400).

20 Claims, 4 Drawing Sheets

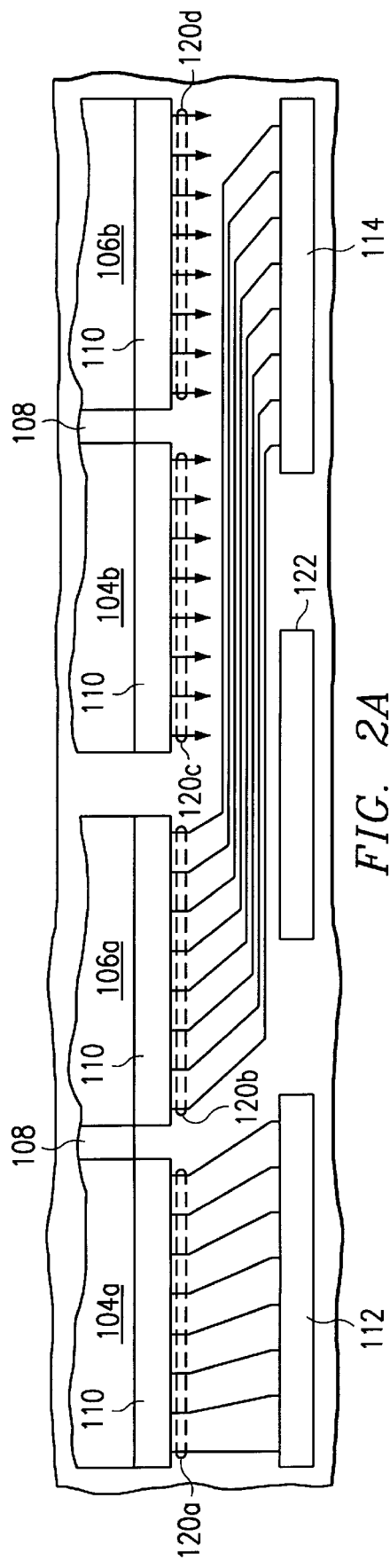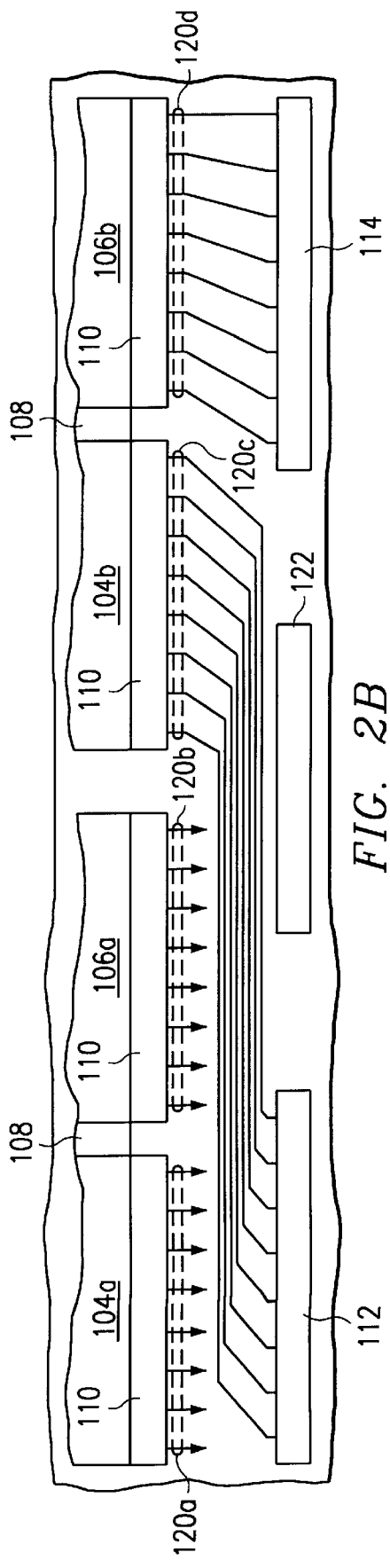

ARCHITECTURE FOR LARGE CAPACITY HIGH-SPEED RANDOM ACCESS MEMORY

This application claims priority under 35 USC §119(e)(1) of provisional application No. 60/088,961 filed Jun. 11, 1998.

TECHNICAL FIELD

The present invention relates generally to semiconductor devices, and more particularly to random access memories (RAMs) with rapid access speeds and high capacities.

BACKGROUND OF THE INVENTION

The increasing operating speed and computing power of electronic systems has given a rise to the need for memory devices having rapid access times and large capacities. In order to ensure that computing cycles are not wasted by a system, large amounts of data must be provided by a semiconductor memory device at as high a rate as possible.

In a typical read operation, a number of memory cells are selected by the application of an address. The data stored within the memory cells are then accessed according to one or more timing signals. For example, in the case of an asynchronous dynamic random access memory (DRAM), a row address is applied in combination with a row address strobe (RAS) timing signal to select a row of memory cells. A column address is then applied in combination with a column address strobe (CAS) timing signal to access selected cells within the row. In the case of a synchronous DRAM (SDRAM), memory cells are selected according to a system clock.

As semiconductor memory devices increase in capacity, they also typically increase in physical size. Larger physical sizes can impact the overall speed of a device, as data and timing signals must propagate across larger distances, adding to the response time of the device. The placement of the conductive lines (the routing) that carry timing and data signals can thus play an important role in the speed of a memory device.

The millions of memory cells within a high-capacity memory device are typically arranged into a number of arrays that are further divided into a number of array banks. Data is output from each array bank by input/output (I/O) lines. A problem with high-capacity memory devices is that all of the I/O lines must be routed to the same I/O circuit. The I/O circuit includes the input buffers, output buffers, and latches necessary to store incoming data in a write operation, or drive outgoing data in a read operation. In the event the I/O circuits are located in a central portion of the semiconductor memory device, a routing "bottleneck" can occur in the central portion of the device. The bottleneck results in large numbers of I/O lines overlapping one another and limiting the available space in the central portion of the device.

One example of a memory device having a routing bottleneck in a central portion of the device is set forth in FIG. 1. FIG. 1 is a top plan view of a SDRAM, illustrating the placement of memory cell banks and various other circuit blocks. The SDRAM is designated by the general reference character 100, and is shown to include four array banks 102a–102d. In the particular example of FIG. 1, the SDRAM has a storage capacity of 256 megabits (Mb); thus each array bank (102a–102d) includes 64 Mb. Each array bank (102a–102d) is further divided into a first and second sub-banks. The first sub-banks are shown as 104a–104d and the second sub-banks are shown as 106a–106d. The memory cells within each sub-bank are accessed by activating associated row address circuitry 108 and column select circuitry 110.

Data within the SDRAM 100 are accessed by way of a first I/O circuit 112, situated between array banks 102a and 102c, and a second I/O circuit 114, situated between array banks 102b and 102d. The I/O circuits (112 and 114) possess the structures necessary to input data for write operations, and to output data in read operations, including I/O pads. When the SDRAM 100 is active in a read or write cycle, the memory cells within one of the array banks (102a–102d) are accessed. In order to make this possible, each array bank (102a–102d) has a data I/O bus that couples data from the array bank to the I/O circuits (112 and 114). Because there are two I/O circuits (112 and 114), each data I/O bus is further divided into two sub-bank buses. One sub-bank bus couples the data from a first sub-bank (104a for example) to the first I/O circuit 112, while the other sub-bank bus couples the data from a second sub-bank (106a for example) to the second I/O circuit 114.

In the particular example of FIG. 1, the general path of only selected I/O lines is illustrated to not unduly clutter the view of the figure. In particular, the first I/O lines (116a, 116b, 116c and 116d) and last I/O lines (118a, 118b, 118c and 1186d) of the sub-bank buses for array banks 102a and 102b are illustrated. Thus, first I/O line 116a and last I/O line 118a are used to represent a first sub-bank bus 120a that connects first sub-bank 104a with the first I/O circuit 112. A second sub-bank bus 120b connects the second sub-bank 106a to the second I/O circuit 114, and is defined by first I/O line 116b and last I/O line 118b. In the same general fashion, sub-bank bus 120c, defined by first I/O line 116c and last I/O line 118c, connects first sub-bank 104b to first I/O circuit 112, and sub-bank bus 120d, defined by first I/O line 116d and last I/O line 118d, connects second sub-bank 106b to the second I/O circuit 114. It is understood that sub-banks 104c, 106c, 104d and 106d are connected to the first and second I/O circuits (112 and 114) in mirror image fashion.

It is noted that the SDRAM 100 further includes a timing circuit 122 located in the central portion of the device. The timing circuit 122 receives timing signals, such as the system clock signal, and in response thereto, activates circuits within the SDRAM that are necessary to access data within the memory cells. The timing path of a memory cell access operation is shown in FIG. 1 by dashed line 124. In response to a clock signal applied to the timing circuit 122, a signal is activated which runs to the sub-bank 106c, and places data on an I/O line. The I/O line is coupled to an I/O bus line, which connects the sub-bank 106c to the second I/O circuit 114. The central location of the timing circuit 122 allows for shorter timing path distances with respect to all of the array banks. Also set forth in FIG. 1, are the word lines 126 that are activated in order to provide the access operation illustrated by line 124.

Referring now to FIGS. 2A and 2B, a portion of FIG. 1 is set forth in a top plan view to provide one representation of the sub-bank bus lines. FIG. 2A provides a representation of sub-bank buses 120a and 120b. It is understood that each of the bus lines set forth in FIG. 2A represents four actual bus lines, giving a total of 32 bus lines in each sub-bank bus. Sub-bank buses 120c and 120d are omitted in FIG. 2A. FIG. 2B sets forth the same view as FIG. 2A, but omits sub-bank buses 120a and 120b, and includes sub-bank buses 120c and 120d. A comparison between FIGS. 2A and 2B illustrates that sub-bank buses 120b and 120c must both travel over the same location, and so overlap one another in the central portion of the SDRAM. This results in an undesirable routing bottleneck in the center of the device.

Referring now to FIG. 3, a top plan view of an alternate SDRAM architecture is set forth. The SDRAM is designated by the general reference character 300, and is shown to include many of the same general elements as FIG. 1. To this extent, like elements will be referred to by the same reference characters, but with the first number being a "3" instead of a "1." Accordingly, the SDRAM 300 of FIG. 3 includes four array banks (302a–302d), each of which includes a first sub-bank (304a–304d) and a second sub-bank (306a–306d). Unlike the SDRAM 100 of FIG. 1, the array banks (306a–306d) extend in the horizontal direction across the entire SDRAM 300. Similarly, the first and second sub-banks (304a–304d and 306a–306d) extend roughly halfway across the SDRAM in the horizontal direction, as opposed to one-fourth the distance as is the case in FIG. 1. The SDRAM 300 of FIG. 3 includes row address circuitry 308, column select circuitry 310, and first and second I/O circuits (312 and 314), all situated in the same general positions as the SDRAM 100 of FIG. 1.

The SDRAM 300 of FIG. 3 includes first I/O lines 316a–316d and second I/O lines 318a–318d that define sub-bank buses (320a–320d). Unlike the sub-bank buses 120a–120d of FIG. 1 which couple an entire sub-bank to an I/O circuit (112 and 114), the sub-bank buses in FIG. 3 each couple half of a sub-bank to half of an I/O circuit. For example, sub-bank bus 320a couples half of sub-banks 304a and 304b to half of I/O circuit 312. Sub-bank bus 320b couples the remaining halves of sub-banks 304a and 304b to the remaining half of I/O circuit 312. In a similar fashion, sub-bank bus 320c connects half of sub-banks 306a and 306b to half of the second I/O circuit 314, while sub-bank bus 320d connects the other halves of sub-banks 306a and 306b to the other half of the second I/O circuit 314.

Like the SDRAM 100 of FIG. 1, the SDRAM 300 includes a centrally located timing circuit 322, and sets forth a timing path 324 and the word lines 326 that are activated in the access operation of the timing path 324. Unlike the SDRAM 100 in FIG. 1, the sub-bank buses (320a–320d) of the SDRAM 300 of FIG. 3 do not overlap, and leave the central portion of the SDRAM 300 without a routing bottleneck. A drawback to the SDRAM 300 of FIG. 3 is that the overall length of the word lines 326 activated in a given cycle is about twice that of the of the SDRAM 100 of FIG. 1. The additional current required to drive the longer word lines results in the architecture of FIG. 3 consuming more power when a row is accessed than the architecture of FIG. 1.

It would be desirable to arrive at an architecture for a high-speed large capacity memory device that does not present a routing bottleneck toward the center of the device. At the same time, the memory device should not consume too much power.

SUMMARY OF THE INVENTION

According to the preferred embodiment, an architecture for a high capacity, high-speed semiconductor memory device includes memory cells that are logically arranged into a number of array banks, each of which is physically separated into a first and second sub-bank. Data input/outputs (I/Os) to the memory device are split between a first I/O circuit, situated toward a first end of the device, and a second I/O circuit, situated toward a second end of the device. The first sub-banks are situated close to the first I/O circuit and have overlapping sub-bank I/O line buses for coupling data from the first sub-banks to the first I/O circuit. In a similar fashion, the second sub-banks are situated close to the second I/O circuit and have overlapping sub-bank I/O line buses for coupling the second sub-banks to the second I/O circuit. This arrangement limits I/O line crossover to the ends of the device, eliminating the need to run I/O lines across the central portion of the device. In this manner, the central portion of the device is freed from I/O line routing bottlenecks.

According to one aspect of the preferred embodiment, the length of word lines activated in a given access operation are relatively small, allowing for reduced power consumption over other architectures.

BRIEF DESCRIPTION OF THE DRAWINGS

FIGS. 2A and 2B are top plan views of a portion of the semiconductor memory device set forth in FIG. 1, illustrating the routing bottleneck of the architecture set forth in FIG. 1.

DETAILED DESCRIPTION OF THE EMBODIMENTS

The preferred embodiment is an architecture for a high-capacity, rapid access semiconductor memory device. The preferred embodiment provides for rapid access times without an input/output (I/O) line bottleneck within the central portion of the device, and without the relatively high power consumption of other semiconductor memory devices. The preferred embodiment architecture achieves advantages over other architectures by utilizing array banks that are physically separated into sub-banks, with each sub-bank being situated close to an associated I/O circuit. The I/O circuits are situated toward the ends of the semiconductor memory device. By situating the sub-banks close to associated I/O circuits, sub-bank buses that connect the sub-banks to the I/O circuits overlap one another toward the ends of the device, avoiding a bottleneck at the center of the device.

Figure 4:
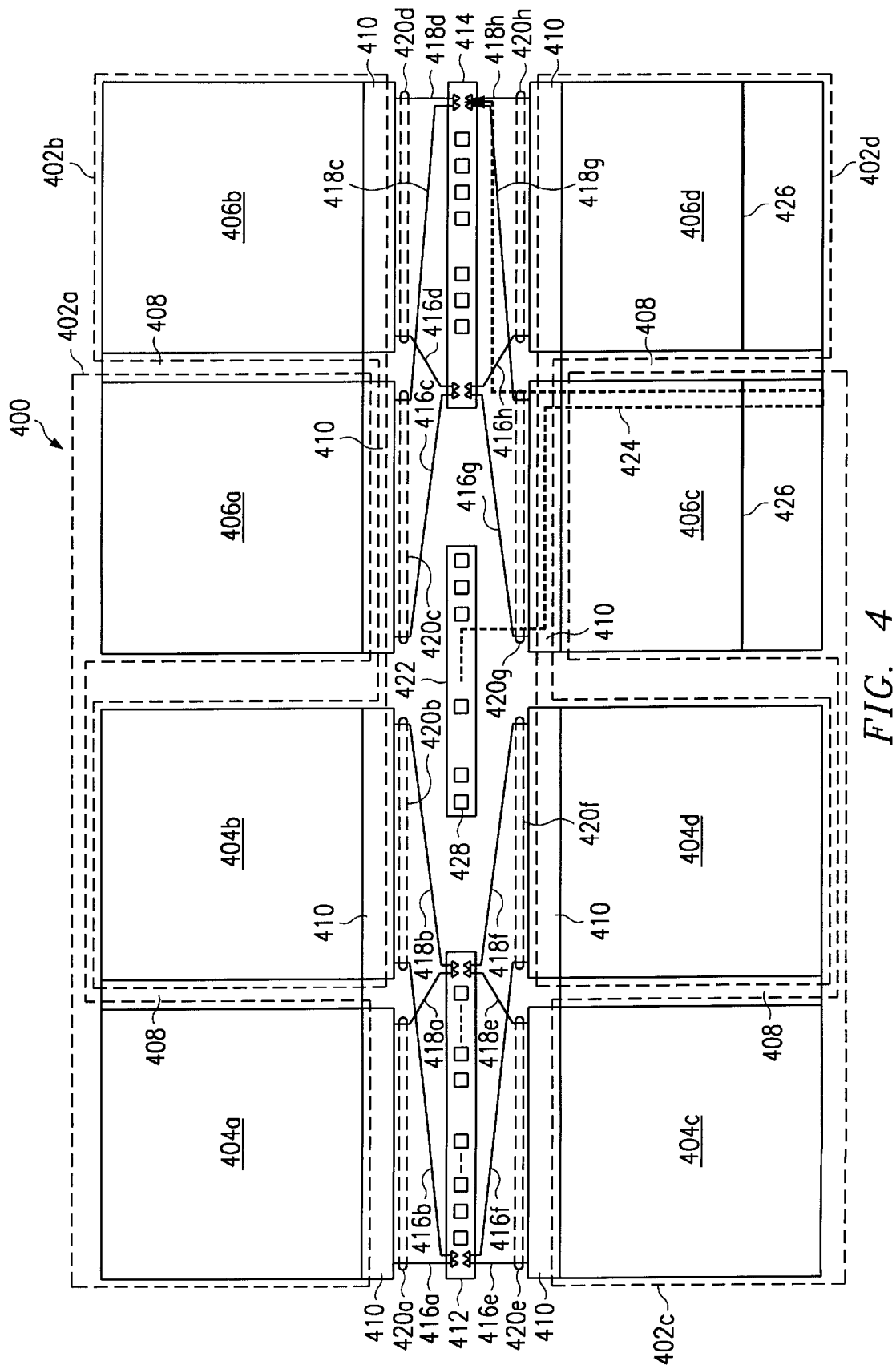
FIG. 4 is a top plan view of the preferred embodiment.

The preferred embodiment is an architecture for a synchronous dynamic random access memory (SDRAM). The SDRAM is set forth in FIG. 4 and designated by the general reference character 400. In the preferred embodiment 400, the array architecture is for a 256 Mb SDRAM. It is understood that the view of FIG. 4 is not drawn to scale, and is intended to represent the general physical arrangement of circuits and lines within the SDRAM 400. The SDRAM 400 includes a number memory cells logically arranged into a number of array banks (402a–402d). The logical arrangement of the array banks (402a–402d) arises out of the manner by which they are addressed. For example, different combination of two address bits could be used to access each array bank. As shown in FIG. 4, the array banks (402a–402d) are further divided into first sub-banks (404a–404d) and a second sub-banks (406a–406d). Unlike other architectures, in the preferred embodiment 400, the sub-banks of the same array are physically separated from one another. For example, in the SDRAM 400 of FIG. 4, array bank 402a is shown to include first sub-bank 404a and second sub-bank 406a. The first sub-bank 404a is physically separated from the second sub-bank 406a in that the sub-banks (404a and 406a) are not adjacent to one another.

Instead, the sub-banks 404a and 406a are separated from one another by first sub-bank 404b. Similarly, the first sub-bank 404b is separated from its associated second sub-bank 406b by the second sub-bank 406a. This arrangement is repeated, in a mirror image fashion, for array banks 402c and 402d.

The memory cells within each sub-bank are accessed by associated row address circuitry 408, that activate word lines within a given sub-bank, and column select circuitry 410, that select bit lines within a given sub-bank.

Access to the memory cells of the SDRAM 400 is accomplished by way of a first I/O circuit 412 and a second I/O circuit 414. The memory cells from the first sub-banks (404a–404d) are accessed by way of the first I/O circuit 412 and the memory cells of the second sub-banks (406a–406d) are accessed by way of the second I/O circuit 414. Thus, each of the I/O circuits (412 and 414) can include data I/O pads that are coupled to the pins of the integrated circuit package that would contain the SDRAM 400. In the preferred embodiment 400, each I/O circuit (412 and 414) includes half of the data I/Os of the SDRAM. Therefore, in the event the SDRAM 400 provides 32 I/Os (is a "×32" device), 16 data I/O pads would be present within each of the I/O circuits (412 and 414).

The physical separation of sub-banks within the same array bank allows each sub-bank to be placed closer to its respective I/O circuit. In particular, as set forth in FIG. 4, the first I/O circuit 412 is situated toward the left end of the device, between the first sub-banks 404a and 404b, and the first sub-banks 404c and 404d. In a similar fashion, the second I/O circuit 414 is situated toward the right end of the device between the second sub-banks 406a and 406b, and the second sub-banks 406c and 406d. Because each sub-bank is situated close to its respective I/O circuit, there is no need to run I/O buses across the center of the device. Furthermore, any overlapping of I/O lines occurs toward the left and right sides of the device, keeping the central portion free.

An alternate way of conceptualizing the preferred embodiment is to consider the sub-banks as being arranged into sub-bank pairs situated on opposing sides of the I/O circuits. In such a case, a first sub-bank pair would include first sub-banks 404a and 404b that is situated on one side of the first I/O circuit 412 (the top side in FIG. 4), and a second sub-bank pair would include first sub-banks 404c and 404d, positioned on an opposing side of the first I/O circuit 412 (the bottom side in the view of FIG. 4). In the same general fashion, a third sub-bank pair (406a and 406b) and fourth sub-bank pair (406c and 406d) are situated on opposing sides of the second I/O circuit 414.

Each of the first sub-banks (404a–404d) is coupled to the first I/O circuit 412 by an associated sub-bank bus. In order to avoid cluttering the view of FIG. 4, only the first and last data I/O line of each sub-bank bus is set forth. Thus, first data I/O line 416a and last data I/O line 418a are intended to define the general connection of a first sub-bank bus 420a to the first I/O circuit 412, it being understood that there are a number of other data I/O lines (not shown in FIG. 4) arranged between the first and last data I/O lines. The remaining pairs of first and last data I/O lines (416b–416h and 418b–418h) define associated sub-bank buses (420b–420h). In the preferred embodiment, each sub-bank bus (420a–420h) includes 32 data I/O lines. It is also understood that the term "data I/O line" could represent a pair of I/O lines that carry complementary data signals.

It is understood that while data I/O lines (416a–416h) and (418a–418h) are shown as generally straight lines, this representation is intended to generally illustrate a starting and ending point of the data I/O lines. The various data I/O lines of the preferred embodiment can include a number of straight, horizontal and/or diagonal segments, in a similar fashion to the data I/O lines set forth in FIGS. 2A and 2B. Furthermore, while the data I/O lines of the preferred embodiment are shown to have one end beginning at the edge of the column address circuits 410, the I/O lines could extend over the sub-banks. In short, the shape, starting points, and ending points, of the data I/O lines of the preferred embodiment can be subject to some variation.

Because adjacent sub-banks access the same I/O circuit, the sub-bank buses are subject to some overlapping. As just one example, sub-bank buses 420a and 420b can be considered to overlap one another. While the overlapping of just one pair of sub-bank buses provides advantages over alternate architectures (by alleviating data I/O line routing bottlenecks) the preferred embodiment completely eliminates bottlenecks in the central portion of the SDRAM 400 by limiting data I/O line crossovers toward the sides of the device. Thus, as set forth in FIG. 4, in addition to the overlap of sub-bank buses 420a and 420b, the remaining sub-bank buses are arranged in overlapping pairs, including sub-bank pairs 420c and 420d, 420e and 420f and 420g and 420h. In this manner, overlapping of data I/O lines is limited toward the right and left ends of the SDRAM 400 advantageously freeing the central portion of the SDRAM 400 from any I/O line routing bottlenecks.

It is understood that while the sub-banks are referred as "overlapping" one another, not every data I/O line of a sub-bank is necessarily overlapped by a data I/O line of the other sub-bank. For example, the data I/O lines towards the ends of the sub-banks (such as the first data I/O lines 416a–416h and last data I/O lines 418a–418h) may not overlap.

An alternate way of conceptualizing the preferred embodiment 400 is to consider all of the data I/O lines coupled to one I/O circuit collectively. Thus, all of the data I/O lines connected to the first I/O circuit 412 can be considered to be first data I/O lines, while all of the data I/O lines connected to the second I/O circuit 414 can be considered to be second data I/O lines. The first data I/O lines would then include overlapping groups, which, in the preferred embodiment 400, would include the sub-bank buses. The same would be true for the second data I/O lines. The second data I/O lines would include overlapping groups (corresponding to sub-bank buses 420c, 420d, 420g and 420h).

Referring yet again to FIG. 4, the preferred embodiment is shown to further include a timing circuit 422 situated in the central portion of the SDRAM 400, between the first I/O circuit 412 and the second I/O circuit 414. The timing circuit 422 receives the clock signals necessary to time various operations within the SDRAM 400. Accordingly, the timing circuit 422 includes clock pads for receiving control and timing signals. The clock pads would be connected to the pins of the integrated circuit package carrying the SDRAM 400. The central location of the timing circuit 422 allows for a short timing access path to all of the various sub-banks. In the view of FIG. 4, word lines within the sub-banks run in the horizontal direction. Accordingly, the first I/O circuit 412, the timing circuit 422, and the second I/O circuit 414 can be considered to be aligned with one another in a word line direction. In addition, in the view of FIG. 4, the left edge and right edge of the SDRAM 400 run in the vertical direction. Thus, the first I/O circuit 412, timing circuit 422, and second I/O circuit 414 can be considered to be perpendicular to the left and right edges of the SDRAM 400.

It is further noted that in the particular embodiment of FIG. 4, the first I/O circuit 412, the timing circuit 422, and the second I/O circuit 414 are aligned with one another in the central portion of the SDRAM 400, in a left-to-right direction in the view of FIG. 4. Thus, if a horizontally disposed axis is imagined as running down the center of the preferred embodiment 400, the first I/O circuit 412, timing circuit 422, and second I/O circuit 414 could be considered to be generally aligned with the axis. Of course, the circuits (412, 422 and 414) could be somewhat offset from one another in the vertical direction, but remain situated between the array banks (402a–402d).

Figure 1:
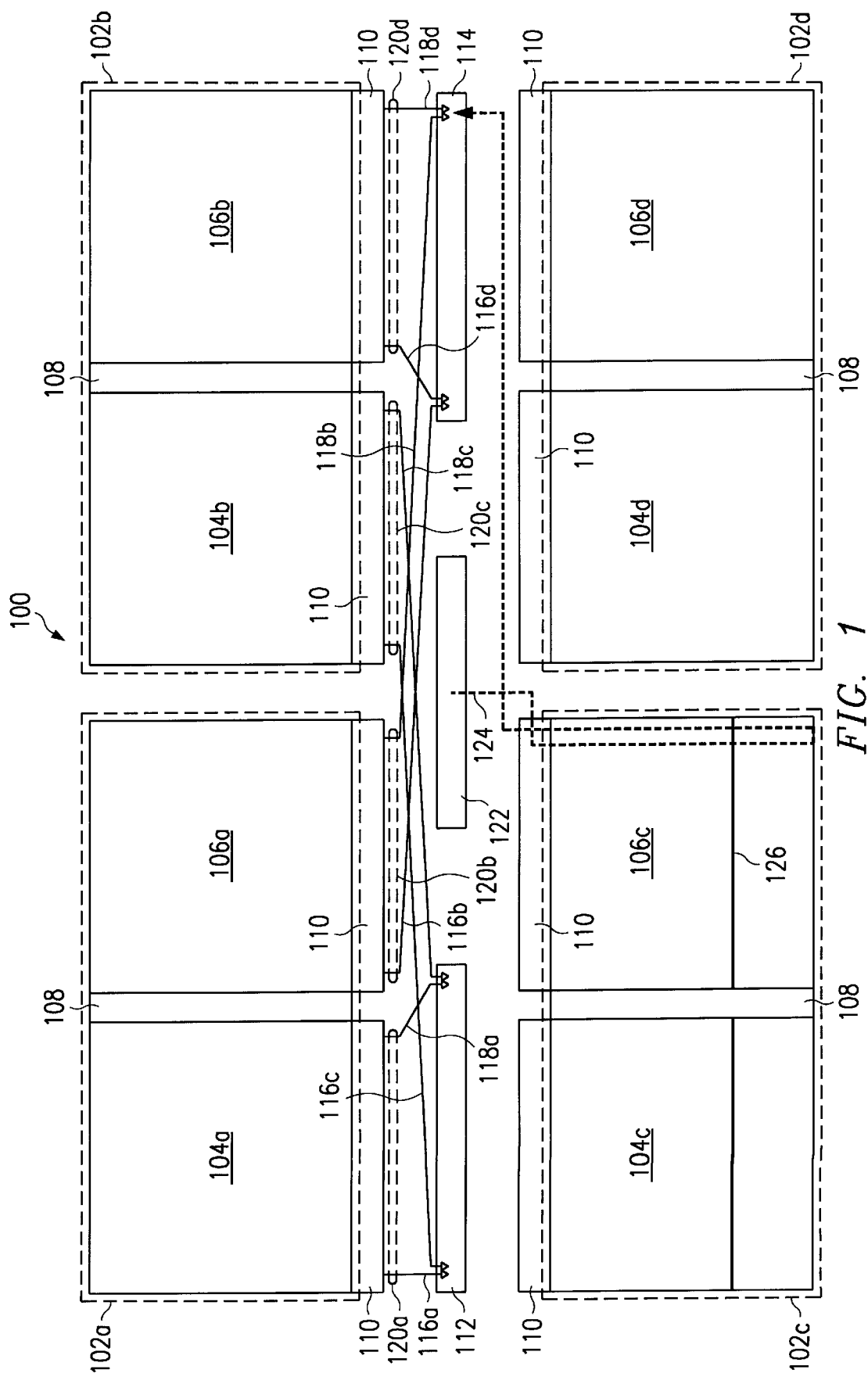
FIG. 1 is a top plan view of a first semiconductor memory device architecture having drawbacks not present in the preferred embodiment.
Figure 3:
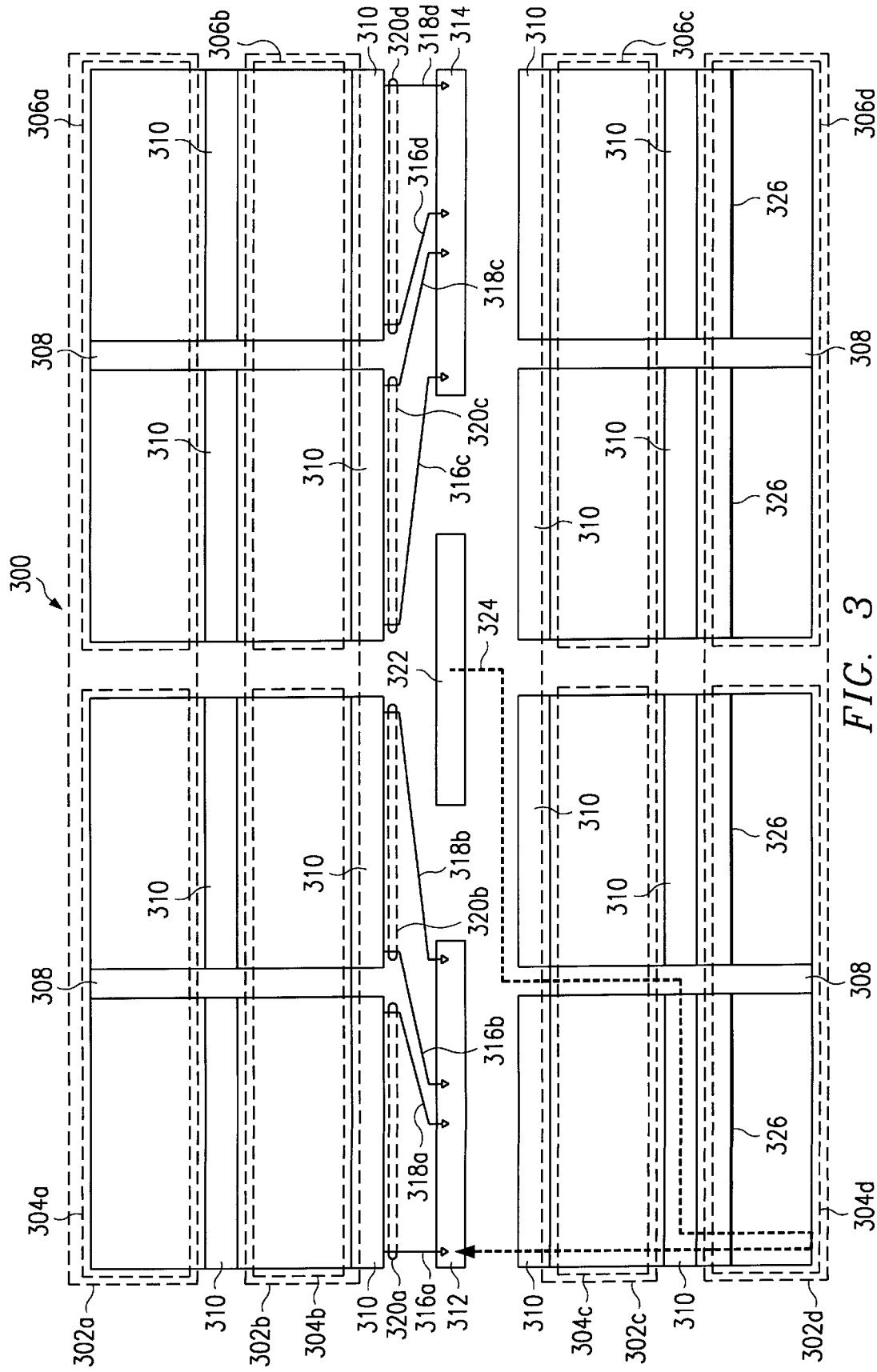
FIG. 3 is a top plan view of a second semiconductor memory device architecture having drawbacks not present in the preferred embodiment.

FIG. 4 also includes an example of a timing access path, shown as the dashed line 424. A clock signal, such as a system clock signal, is received and buffered within the timing circuit 422. A row is activated (shown as item 426), and a column is accessed to place data on an I/O line. The data is coupled to the second I/O circuit 414. It is noted that the overall general length of the word lines that are activated in an access operation in the architecture of FIG. 4 is equivalent to that of the architecture in FIG. 1, and roughly equivalent to half of that of the architecture in FIG. 3. Thus, the preferred embodiment 400 provides a memory device architecture without the central I/O line bottleneck, and without undue power consumption arising out of the activation of long word lines.

Further included within FIG. 4 are a number of I/O pads, represented by square-shaped items situated within the first I/O circuit 412, the timing circuit 422, and the second I/O circuit 414. One is identified as item 428 within the timing circuit 422. The I/O pads 428 are intended to indicate the general location of I/O pads within the given circuits, and should not be construed as limiting the present invention to any particular configuration. As just one example, while single rows of I/O pads are shown in FIG. 4, the circuits (412, 422 and 414) could contain multiple rows of I/O pads.

While the preferred embodiment sets forth an architecture for a high-density high speed SDRAM, the teachings set forth herein may also be applied to other types of memory devices including ferroelectric RAMs, static RAMs, and electrically erasable and programmable read-only-memories (EEPROMs), to name just a few. Along these same lines, the teachings of the preferred embodiment are applicable to smaller capacity memory devices in which it is desirable to keep the central portion of the memory device free from I/O lines routing bottlenecks. It is also understood that the teachings of this disclosure are not limited to "standalone" semiconductor memory devices, and are also applicable to "integrated" memory applications (i.e., a memory array integrated into a higher function integrated circuit). In an integrated application, the terms identifying the "central portion" and "ends" of the memory device would apply to the integrated memory structure, and not the overall higher function integrated circuit.

Accordingly, it is understood that while the present invention has been described in terms of a detailed preferred embodiment, various changes, substitutions, and alterations could be made without departing from the spirit and scope of the invention. Accordingly, the present invention is intended to be limited only as defined by the appended claims.

What is claimed is:

1. In a semiconductor memory device having a plurality of memory cells, a memory device architecture, comprising:

a first input/output (I/O) circuit that provides access to a portion of the semiconductor memory device;

a second I/O circuit that provides access to another portion of the semiconductor memory device;

the plurality of memory cells being logically arranged into a plurality of array banks, including a first array bank and a second array bank, each array bank being physically divided into sub-banks, including a first sub-bank and a second sub-bank, the first sub-banks being disposed adjacent to one another and proximate to the first I/O circuit, the second sub-banks being disposed adjacent to one another and proximate to the second I/O circuit;

a first group of first I/O bus lines coupling the first I/O circuit to the first sub-bank of the first array bank;

a second group of first I/O bus lines coupling the first I/O circuit to the first sub-bank of the second array bank, the first group of first I/O bus lines and the second group of first I/O bus lines substantially overlapping one another;

a first group of second I/O bus lines coupling the second I/O circuit to the second sub-bank of the array first bank; and a second group of second I/O bus lines coupling the second I/O circuit to the second sub-bank of the second array bank, the first group of second I/O bus lines and the second group of second I/O bus lines substantially overlapping one another.

2. The semiconductor memory device of claim 1, wherein:

the first I/O circuit and second I/O circuit each include a plurality of data I/O pads.

3. The semiconductor memory device of claim 1, wherein:

the first I/O circuit and second I/O circuit are generally aligned with one another along a first axis.

4. The semiconductor memory device of claim 3, further including:

a clock circuit that provides timing signals to the semiconductor memory device, the clock circuit being disposed between the first I/O circuit and the second I/O circuit and generally aligned with the first axis.

5. The semiconductor memory device of claim 4, wherein:

the semiconductor memory device is a synchronous random access memory device and the clock circuit receives a system clock signal.

6. The semiconductor memory device of claim 1, wherein:

the plurality memory cells is further arranged to include a third array bank and a fourth array bank, each including a first sub-bank and a second sub-bank, the first sub-banks of the third and fourth array banks being disposed adjacent to one another and proximate to the first I/O circuit, the second sub-banks of the third and fourth array banks being disposed adjacent to one another and proximate to the second I/O circuit;

a third group of first I/O bus lines coupling the first I/O circuit to the first sub-bank of the third array bank;

a fourth group of first I/O bus lines coupling the first I/O circuit to the first sub-bank of the fourth array bank, the third group of first I/O bus lines and the fourth group of first I/O bus lines substantially overlapping one another;

a third group of second I/O bus lines coupling the second I/O circuit to the second sub-bank of the third array bank; and a fourth group of second I/O bus lines coupling the second I/O circuit to the second sub-bank of the fourth array bank, the third group of second I/O bus lines and the fourth group of second I/O bus lines substantially overlapping one another.

7. The semiconductor memory device of claim 6, further including:

the area occupied by the first I/O circuit is defined by a first side and a second side;

the first sub-banks of the first and second array banks are disposed generally adjacent to the first side of the first I/O circuit;

the first sub-banks of the third and fourth array banks are disposed generally adjacent to the second side of the first I/O circuit;

the area occupied by the second I/O circuit is defined by a first side and a second side;

the second sub-banks of the first and second array banks are disposed generally adjacent to the first side of the second I/O circuit; and the second sub-banks of the third and fourth array banks are disposed generally adjacent to the second side of the second I/O circuit.

8. A random access memory (RAM) architecture, comprising:

a plurality of memory cells arranged into a number of memory cell sub-bank pairs, the sub-banks including, a first sub-bank pair having a first sub-bank that is accessed by a first combination of high order address bits and a second sub-bank that is accessed by a second combination of high order address bits, a second sub-bank pair adjacent to the first sub-bank pair in a first direction, the second sub-bank having a third sub-bank that is accessed by the first combination of high order address bits and a fourth sub-bank that is accessed by the second combination of high order address bits, a third sub-bank pair adjacent to the first sub-bank pair in a second direction generally perpendicular to first direction, the third sub-bank pair including a fifth sub-bank that is accessed by a third combination of higher order address bits and a sixth sub-bank that is accessed by a fourth combination of high order address bits, and a fourth sub-bank pair adjacent to the third sub-bank pair in the first direction, the fourth sub-bank pair including a seventh sub-bank that is accessed by the third combination of higher order address bits and an eighth sub-bank that is accessed by the fourth combination of high order address bits;

a first input/output (I/O) circuit that inputs and outputs data on a plurality of first data I/O pads, the first I/O circuit being disposed between the first sub-bank pair and the third sub-bank pair;

a second I/O circuit that inputs and outputs data on a plurality of second data I/O pads, the second I/O circuit being disposed between the second sub-bank pair and the fourth sub-bank pair;

a first data bus coupling data between the first sub-bank pair and the first I/O circuit;

a second data bus coupling data between the second sub-bank pair and the second I/O circuit;

a third data bus coupling data between the third sub-bank pair and the first I/O circuit; and a fourth data bus coupling data between the fourth sub-bank pair and the second I/O circuit.

9. The RAM architecture of claim 8, wherein:

the first data bus includes a first sub-bank bus that couples data between the first sub-bank and the first I/O circuit, and a second sub-bank bus that couples data between the second sub-bank and the first I/O circuit; and the second data bus includes a third sub-bank bus that couples data between the third sub-bank and the second I/O circuit, and a fourth sub-bank bus that couples data between the fourth sub-bank and the second I/O circuit.

10. The RAM architecture of claim 9, wherein:

the first sub-bank bus and second sub-bank bus substantially overlap.

11. The RAM architecture of claim 9, wherein:

the third sub-bank bus and fourth sub-bank bus substantially overlap.

12. The RAM architecture of claim 8, wherein:

the third data bus includes a fifth sub-bank bus that couples data between the fifth sub-bank and the first I/O circuit, and a sixth sub-bank bus that couples data between the sixth sub-bank and the first I/O circuit; and the fourth data bus includes a seventh sub-bank bus that couples data between the seventh sub-bank and the second I/O circuit, and an eighth sub-bank bus that couples data between the eighth sub-bank and the second I/O circuit.

13. The RAM architecture of claim 12, wherein:

the fifth sub-bank bus and sixth sub-bank bus substantially overlap.

14. The RAM architecture of claim 12, wherein:

the seventh sub-bank bus and eighth sub-bank bus substantially overlap.

15. A semiconductor memory device that provides a plurality of data outputs, the semiconductor memory device, comprising:

a first end defining the limits of the semiconductor memory device;

a second end, generally opposite to the first end, further defining the limits of the semiconductor memory device;

a central portion situated between the first end and the second end;

a first input/output (I/O) circuit formed between the first end and the central portion, the first I/O circuit providing a first number of the data outputs;

a second I/O circuit formed between the second end and the central portion, the second I/O circuit providing a second number of the data outputs;

a plurality of memory cells logically arranged into a plurality of array banks, including a first array bank having a first portion disposed proximate to the first I/O circuit and a second portion disposed proximate to the second I/O circuit;

a second array bank having a first portion disposed proximate to the first I/O circuit and a second portion disposed proximate to the second I/O circuit;

a first set of overlapping I/O lines coupling the first portion of the first array and the first portion of the second array to the first I/O circuit; and a second set of overlapping I/O lines coupling the second portion of the first array and the second portion of the second array to the second I/O circuit.

16. The semiconductor device of claim 15, wherein:

the central portion includes a clock circuit that receives at least one external timing signal and provides a plurality of internal timing control signals.

17. The semiconductor device of claim 16, wherein:

the first I/O circuit includes a plurality of first data output pads arranged generally perpendicular to the first end;

the second I/O circuit includes a plurality of second data output pads generally parallel to the first data output pads; and the central portion includes a plurality of clock input pads generally parallel to the first data output pads.

18. The semiconductor device of claim 15, wherein:

the plurality of memory cells are arranged into rows and columns, the rows being generally perpendicular to the first end, the columns being generally perpendicular to the rows.

19. The semiconductor device of claim 18, wherein:

the first I/O circuit includes a plurality of first data output pads arranged generally parallel to the memory cell rows; and the second I/O circuit includes a plurality of second data output pads generally parallel to the memory cell rows.

20. The semiconductor device of claim 15, wherein:

the plurality of memory cells include dynamic random access memory cells.

* * * * *